United States Patent

Hachisuka

(10) Patent No.: US 6,486,516 B1
(45) Date of Patent: Nov. 26, 2002

(54) SEMICONDUCTOR DEVICE AND A METHOD OF PRODUCING THE SAME

(75) Inventor: Atsushi Hachisuka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/563,510

(22) Filed: May 3, 2000

(30) Foreign Application Priority Data

Jan. 11, 2000 (JP) ........................................ 2000-002356

(51) Int. Cl.$^7$ ............................................... H01L 29/94
(52) U.S. Cl. ..................... 257/368; 257/369; 257/296; 257/297; 257/298; 257/299; 257/300; 257/344; 257/371; 257/382; 257/383; 257/384; 257/900; 257/903
(58) Field of Search ................................. 257/296–300, 257/344, 368.9, 371, 382–384, 900, 903

(56) References Cited

U.S. PATENT DOCUMENTS

| | | | | |
|---|---|---|---|---|
| 6,004,843 A | * | 12/1999 | Huang | 438/241 |
| 6,124,610 A | * | 9/2000 | Cheek et al. | 257/328 |
| 6,303,432 B1 | * | 10/2001 | Horita et al. | 438/253 |
| 6,218,235 B1 | * | 4/2002 | Hachisuka et al. | 438/241 |
| 6,245,624 B1 | * | 6/2002 | Kim et al. | 438/305 |

FOREIGN PATENT DOCUMENTS

| | | | |
|---|---|---|---|
| JP | 9-219517 | | 8/1997 |
| JP | 11-68103 | | 3/1999 |
| JP | 11-297991 | * | 10/1999 |
| JP | 2000150681 A | * | 5/2000 |
| JP | 2000150681 | * | 5/2000 |
| KR | 1994-0002447 | | 3/1994 |

* cited by examiner

*Primary Examiner*—Nathan J. Flynn
*Assistant Examiner*—Ahmed N. Sefer
(74) *Attorney, Agent, or Firm*—McDermott, Will & Emery

(57) ABSTRACT

A semiconductor device and a method of producing the semiconductor device, fabricated by forming a memory device and a logic device on a single semiconductor substrate, are provided. A side wall (9) and a silicide protection film (10) of a gate electrode (7e) are used instead of forming a silicide protection film in a logic device region (101), whereby the number of steps in forming a logic process consolidating device can be reduced. Further, high concentration impurity regions are formed using the silicide protection film (10) as a mask, whereby a degree of freedom of a condition of implanting ions becomes high. In a memory device region (100), because the silicide protection film does not remain, an opening (17) can be formed in a self-replicating manner without deteriorating reliability of the semiconductor device, whereby it is possible to realize a preferable electrical connection between a source/drain area of the semiconductor device to a wiring layer in a self-alignment contact opening of the memory device region (100).

1 Claim, 10 Drawing Sheets

62c 56c 56d 62d
70c   70d

F I G. 19
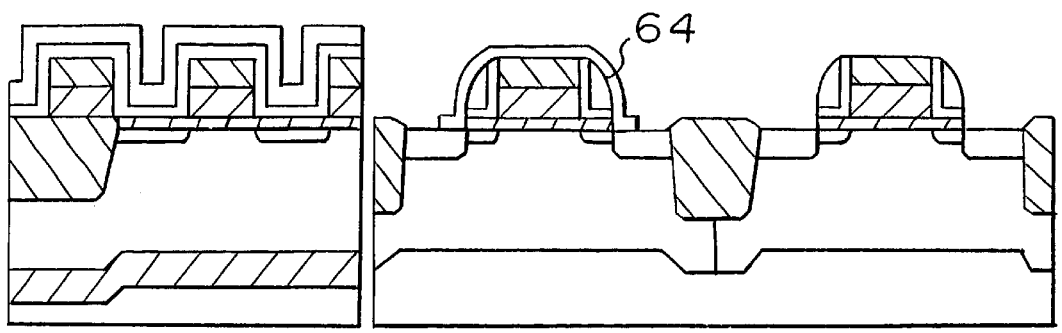
F I G. 20
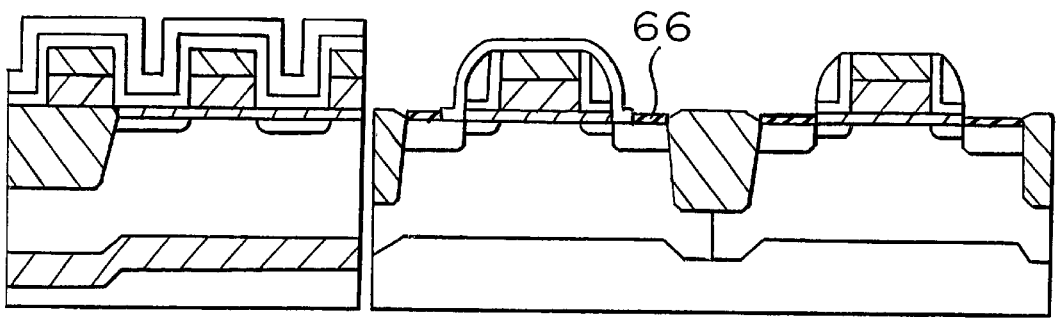
F I G. 21
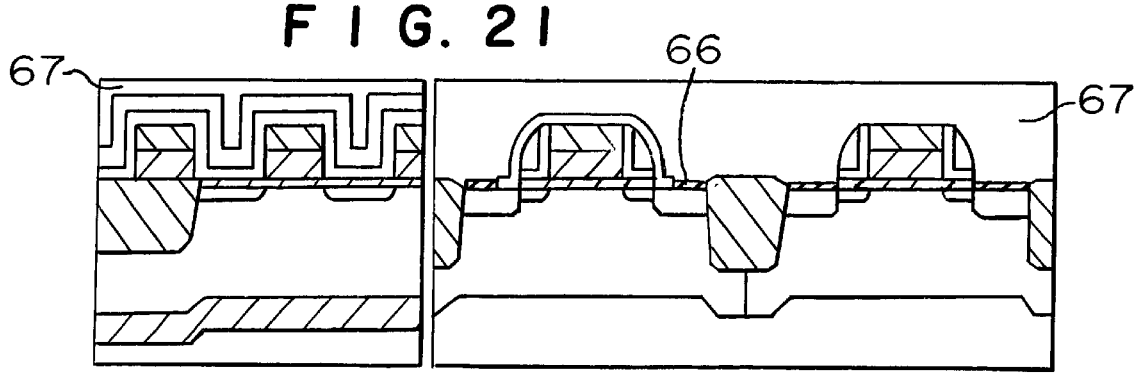
F I G. 22
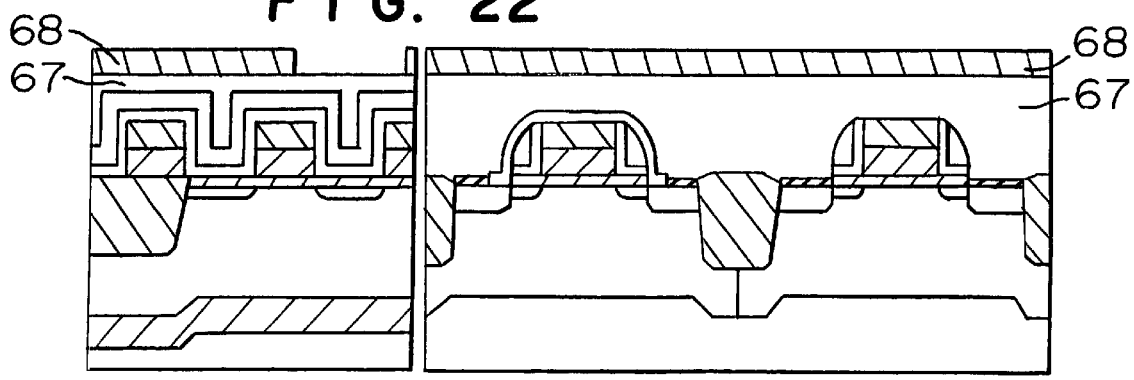

F I G. 26
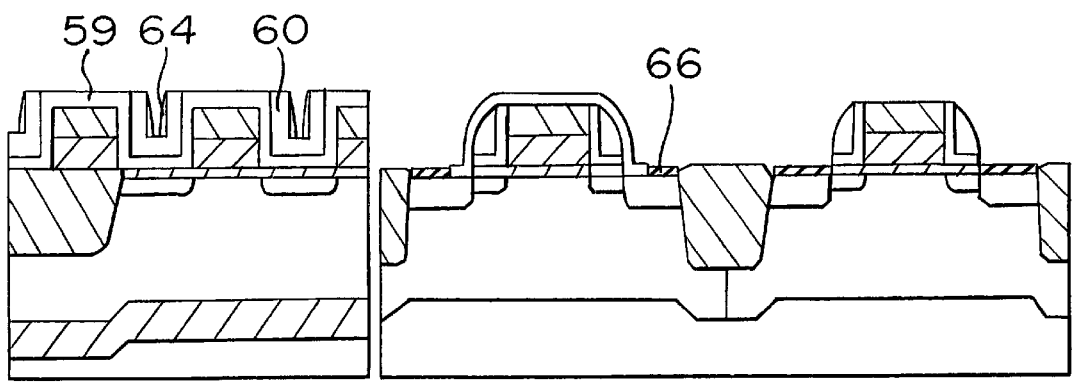
F I G. 27
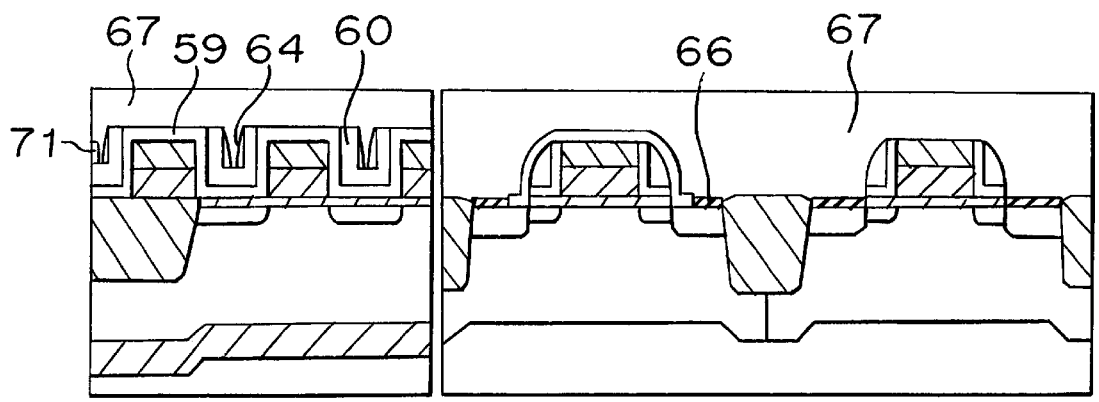
F I G. 28
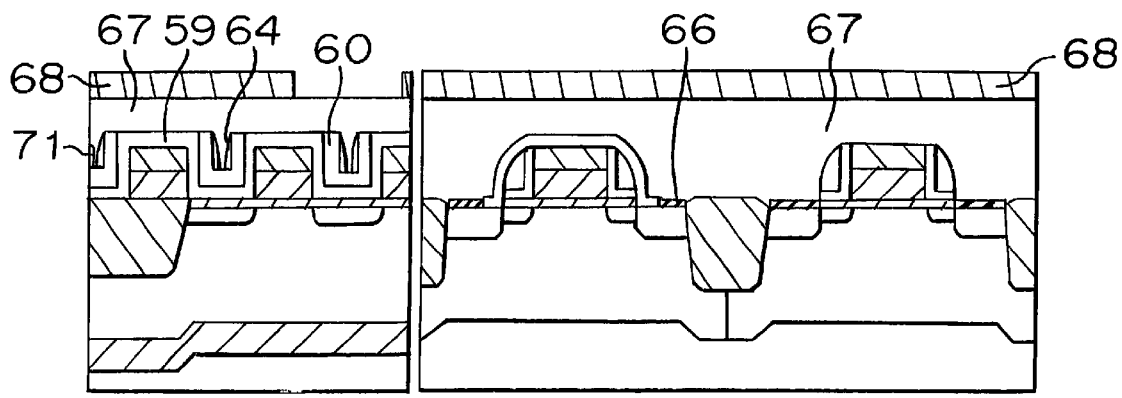

SEMICONDUCTOR DEVICE AND A METHOD OF PRODUCING THE SAME

BACKGROUND OF THE INVENTION

1. Field of the Invention

The present invention relates to a semiconductor device and a method of producing the same, in particular to, a semiconductor device having a semiconductor substrate, on which both of a memory device and a logic device are formed, hereinbelow referred to as a logic process consolidating device, and a method of producing the semiconductor device.

2. Discussion of Background

In recent years, it is required that semiconductor devices are formed to be a single chip in response to an age of multimedia. For example, a memory device such as a dynamic random access memory (DRAM), a static random access memory (SRAM), and a flash memory, and a logic device are formed on a single semiconductor substrate and mounted on a single chip.

FIG. 24 is a cross-sectional view illustrating a structure of a conventional logic process consolidating DRAM. In FIG. 24, numerical reference 100 designates a memory device region; and numerical reference 101 designates a logic device region. Hereinbelow, the structure of the conventional logic process consolidating DRAM will be described in reference of FIG. 24.

A cross-sectional structure of the memory device region of the conventional logic process consolidation DRAM will be described. In the memory device region, an active region formed by a bottom n-well 52 and a p-well region 53a formed on a bottom n-well 52 is located on a silicon substrate 51. On a principle surface of the silicon substrate 51, an isolating region 54 and a gate oxide film 55 are formed. On the p-well region 53a surrounded by the isolating region 54 has source/drain areas 56a, 56b.

On the gate oxide film 55 and an isolating oxide film 54, gate electrodes 57a through 57c are formed with a predetermined interval. On upper surfaces of the gate electrodes 57a through 57c, for example, an insulating film 58 made of a silicon nitride film or a TEOS oxide film is formed. Further, a silicon oxide film 59 is formed on the insulating film 58, the source/drain areas 56a, 56b, and the isolating region 54 so as to cover these. A silicon nitride film 60 is formed so as to cover an upper surface of the silicon oxide film 59. Further, an inter-layer insulating film 67 is formed to cover the silicon nitride film 60.

Above the source/drain area 56b, the inter-layer insulating film 67, the silicon nitride film 60, the silicon oxide film 59, a part of the insulating film 58 formed on the gate electrodes 57b and 57c, and a self-alignment contact opening 69 for exposing the gate oxide film 55 are formed. The self-alignment contact opening 69 is formed to expose a surface of the source/drain area 56b.

A plug made of a conductive material and so on is formed in the self-alignment contact opening 69. Such a plug is used as a contact for, for example, a storage node contact of a bit wire or a capacitor cell. After forming the plug, a lower electrode (not shown) of a bit wire or a capacitor is formed. The lower electrode of a bit wire or the capacitor is electrically connected to the source/drain area 56b through the plug.

Meanwhile, in the logic device region, the isolating region 54 is formed on a principle surface of the silicon substrate 51. Further, on the active region surrounded by the isolating region 54, the n-well region 53b and the p-well region 53c are respectively formed. In the n-well region 53b, low concentration impurity regions 56c, 56d and high concentration impurity regions 62c, 62d are formed, whereby source/drain regions 70c, 70d having a lightly doped drain (LDD) structure are configurated.

Further, in the p-well region 53c of the silicon substrate 51, low concentration impurity regions 56e, 56f and high concentration impurity regions 62a, 62b are formed, whereby source/drain areas 70a, 70b having a LDD structure are configurated. On a channel region between source/drain areas 70c and 70d, a gate electrode 57d is formed through a gate oxide film 55. Further, in the p-well region 53c, a gate electrode 57e is formed through the gate oxide film 55.

The insulating film 58 made of a silicon nitride film or a TEOS oxide film is formed respectively on upper surfaces of the gate electrodes 57d and 57e. A side wall made of the silicon oxide film 59 and the silicon nitride film 60 is formed so as to be in contact with side surfaces of the gate electrode 57d and the insulating film 58. In a similar manner, a side wall made of the silicon oxide film 59 and the silicon nitride film 60 is formed so as to be in contact with side surfaces of the gate electrode 57e and the insulating film 58.

A silicide protection film 64 is formed to cover parts respectively of the insulating film 58 formed on the upper surface of the gate electrode 57d, a surface of the side wall, and the source/drain areas 62c, 62d. On the source/drain areas 70a through 70d without the silicide protection film 64, a high-melting metallic silicide film 66 made of, for example, a cobalt silicide film, a titanium silicide film, and so on is formed. The inter-layer insulating film 67 is formed above an entire surface of the semiconductor substrate 51.

In the conventional logic process consolidating device, a conduction type of the active region and a conduction type of the impurities to be implanted are not limited to those described above, and adverse conduction types may be used.

In the next, in reference of FIGS. 13 through 24, a method of producing the conventional logic process consolidating device will be described. In FIG. 13, the isolating region 54 is formed on the principle surface of the silicon substrate 51, in which the bottom n-well 52, the p-well region 53a, the n-well region 53b and the p-well region 53c are formed. A structure of isolating of the isolating region 54 is obtained by opening a deep groove in the silicon substrate 51, and embedding an insulating film such as an oxide film in use of a Shallow Trench Isolation (STI) process, whereby the structure of isolation becomes flat.

The gate oxide film 55 is formed on the principle surface of the silicon substrate 51. In a predetermined area on the gate oxide film 55 or the isolating oxide film 54, the gate electrodes 57a through 57e are formed. An n-type impurity is implanted in the p-well regions 53a, 53c in the silicon substrate 51 by ion implantation. A p-type impurity is implanted in the n-well 53b in the silicon substrate 51 by ion implantation. Thus, the source/drain areas 56a, 56b and the low concentration impurity regions 56c through 56f are formed. As illustrated in FIG. 14, the silicon oxide film 59 is formed above the entire surface of the silicon substrate 51 so as to cover the gate electrodes 57a through 57e and the insulating film 58 formed thereon. The silicon nitride film 60 is formed on the silicon oxide film 59. As illustrated in FIG. 15, a resist 61 is coated, and an n-type transistor area in the logic device region is opened by photoengraving.

In the next, the silicon oxide film 59 and the silicon nitride film 60 are subjected to anisotropic etching to form side walls on both sides of the gate electrode 57e. An n-type impurity is further implanted in a self-replicating manner using the side walls and so on as a mask to form the high concentration impurity regions 62a, 62b. The source/drain area 70a having the LDD structure is configured by the low concentration impurity region 56e and the high concentration impurity region 62a. Further, the source/drain area 70b having the LDD structure is configured by the low concentration impurity region 56f and the high concentration impurity region 62b.

As illustrated in FIG. 16, the resist 63 is coated, and the p-type transistor region in the logic device region is opened by photoengraving. Succeedingly, the silicon oxide film 59 and the silicon nitride film 60 are subjected to anisotropic etching to form side walls on both sides of the gate electrode 57d. A p-type impurity is further implanted in a self-replicating manner using the side walls and so on as a mask to form the high concentration impurity regions 62c, 62d. The source/drain area 70c having the LDD structure is configured by the low concentration impurity region 56c and the high concentration impurity region 62c. The source/drain area 70d having the LDD structure is configured by the low concentration impurity region 56d and the high concentration impurity region 62d.

After removing the resist 63, a silicon oxide film 64 is formed above an entire surface of the silicon substrate 51 to be served as a silicide protection film in the logic device as illustrated in FIG. 17. In the next, a resist is coated, and a resist pattern 65 is formed by photoengraving as illustrated in FIG. 18. Further, the silicon oxide film 64 is subjected to anisotropic etching using the resist pattern 65 as a mask, whereby the resist pattern 65 is removed as illustrated in FIG. 19. As illustrated in FIG. 20, the high melting point metal silicide film 66 is formed on surfaces of the source/drain areas 70a through 70d externally exposed.

As illustrated in FIG. 21, the inter-layer insulating film 67 is formed above the entire surface of the silicon substrate 51. As illustrated in FIG. 22, a resist 68 is coated, and the resist above the source/drain area 56b in the memory device region is patterned by photoengraving. As illustrated in FIG. 23, the inter-layer insulating film 67 is subjected to anisotropic etching using the resist 68 as a mask and using the silicon nitride film 60 as an etching stopper.

Then, the resist 68 is removed. As illustrated in FIG. 24, the silicon nitride film 60, the silicon oxide film 59, and the insulating film 58 are subjected to anisotropic etching in a self-replicating manner to expose the source/drain area 56b. Thus, the self-alignment contact opening 69 is formed.

FIGS. 25 through 30 are cross-sectional views for illustrating a structure of the conventional logic process consolidating device, wherein problems in steps after the step illustrated in FIG. 18 are explained. Processes of the method of producing the device will be briefly described in reference of FIGS. 25 through 30. As illustrated in FIG. 18, in the conventional logic process consolidating device, a silicide protection film 64 is formed even in a memory device region, in which the silicide protection film 64 is unnecessary. As illustrated in FIG. 25, the silicide protection film 64 is etched using a resist pattern 65 as a mask. As illustrated in FIG. 26, a high-melting metallic silicide film 66 is formed on exposing surfaces of source/drain areas 70a through 70d.

As illustrated in FIG. 27, an inter-layer insulating film 67 is formed above an entire surface of a silicon substrate 51. Thereafter, as illustrated in FIG. 28, a resist 68 is coated, and a part of the resist above a source/drain area 56b in the memory device region is patterned by photoengraving. As illustrated in FIG. 29, the inter-layer insulating film 67 is subjected to anisotropic etching using the resist 68 as a mask and a silicon nitride film 60 as an etching stopper. The resist 68 is removed. As illustrated in FIG. 30, the silicon nitride film 60, a silicon oxide film 59, and an insulating film 58 are subjected to anisotropic etching in a self-replicating manner to expose the source/drain area 56b, whereby a self-alignment contact opening 69 is formed.

As illustrated in FIG. 25, in the conventional logic process consolidating device, the silicon nitride film 60 above gate electrodes 57a through 57c is etched as a result of overetching, which occurs at time of etching the silicide protection film 64 in the memory device region. Therefore, any etching stopper does not exist above the source/drain area 56b, whereby there is a possibility that the gate electrode is exposed at time of forming the self-alignment contact opening 69. When the gate electrode is exposed, there is a problem that a wiring layer such as a bit wire formed after forming the self-alignment contact opening 69 is shorted with the gate electrode, wherein reliability of the semiconductor device is deteriorated.

Meanwhile, as illustrated in FIG. 25, it is difficult to etch the silicide protection film 64 between the gate electrodes to completely remove this because an aspect ratio between the gate electrodes is high. Thus the silicide protection film 64 is left between the gate electrodes. The aspect ratio between the gate electrodes are further increased by the remaining silicide protection film 64. As a result, as illustrated in FIG. 27, the inter-layer insulating film 67 is not formed between the gate electrodes at time of forming the inter-layer insulating film 67 made of BPSG and so on, whereby a cavity is formed therein. Accordingly, there is a problem that transistors are not securely insulated, wherein reliability of the semiconductor device is deteriorated.

Further, because the remaining silicide protection film 64 left at time of etching the inter-layer insulating film 67 in steps illustrated in FIGS. 28 and 29 is hardly etched since the remaining silicide protection film 64 does not contain boron or phosphorous. Thus, the remaining silicide protection film 64 is left between the gate electrodes 57b, 57c and a hole. Accordingly, there are problems that the aspect ratio of the self-alignment contact opening 69 is increased as illustrated in FIG. 30, and it becomes difficult to connect a wiring layer formed after forming the self-alignment contact opening 69 to the source/drain area 56b in the silicon substrate 51.

Further, in the logic process consolidating device, because there are processes for all of devices integrated in the logic process consolidating device and processes for a single device, the number of steps for forming the logic process consolidating device is increased, wherein the producing process is in tendency of complicating.

SUMMARY OF THE INVENTION

It is an object of the present invention to solve the above-mentioned problems in the conventional logic process consolidating device and to provide a semiconductor device having different devices on one semiconductor substrate, namely a logic process consolidating device, and a method of producing the semiconductor device without complicating a production process.

According to a first aspect of the present invention, there is provided a semiconductor device having a memory device region (100) and a logic device region (101) on a principle surface of a semiconductor substrate comprising:

a pair of first and second source/drain areas (6a, 6b) formed with an interval so as to sandwich a first channel region (3a) on a principle surface of the memory device region (100);

a pair of first and second low concentration impurity regions (6c, 6d) formed with intervals so as to sandwich a second channel region (3b) on a principle surface of the logic device region;

a first gate electrode (7b) and a second gate electrode (7d) formed on a gate oxide film (5) respectively formed on the first channel region (3a) and second channel region (3b);

a silicon oxide film (9) formed so as to cover the first gate electrode (7b) and the second gate electrode (7d);

a silicon nitride film (10) formed on the silicon oxide film (9);

an inter-layer insulating film (15) formed on the silicon nitride film (10);

a self-alignment contact opening (17) formed in an area above the first source/drain area (6b) of the inter-layer insulating film (15), the silicon nitride film (10), and the silicon oxide film (9) formed on the memory device area (100);

a side wall film made of the silicon oxide film (9) and the silicon nitride film (10) extending through areas above the first and the second low concentration impurity regions (6c, 6d) so as to cover an upper portion and a side wall of the second gate electrode (7d); and first and second high concentration impurity regions (12c, 12d) formed from ends of the side wall film on the semiconductor substrate (1).

According to a second aspect of the present invention, there is provided the semiconductor device, wherein the silicon oxide film (9) and the silicon nitride film (10) formed on the upper portion and the side surface of the second gate electrode (7d) in the logic device region (101) have a function as a silicide protection film in addition to a function as the side wall film for the second gate electrode (7d).

According to a third aspect of the present invention, there is provided a method of producing a semiconductor device having a memory device region (100) and a logic device region (101) on a principle surface of a semiconductor substrate (1) comprising steps of:

forming a pair of first and second source/drain areas (6a, 6b) with an interval so as to sandwich a first channel region (3a) on the memory device region (100) and a pair of first and second low concentration impurity regions (6e, 6f) with an interval so as to sandwich a second channel region (3c) in the logic device region (101);

forming a first gate electrode (7b) and a second gate electrode (7e) on gate oxide films (5) respectively above the first channel region (3a) and the second channel region (3c);

forming a silicon oxide film (9) on the semiconductor substrate (1) so as to cover the first gate electrode (7b) and the second gate electrode (7e);

forming a silicon nitride film (10) on the silicon oxide film (9);

coating a resist (11) on an upper portion of the second gate electrode (7e) and providing the silicon oxide film (9) and the silicon nitride film (10) with anisotropic etching using the resist as a mask; and implanting impurity ions into the semiconductor substrate (1) in a self-replicating manner using the resist (11), the silicon oxide film (9), and the silicon nitride film (10) as a mask to form first and second high concentration impurity regions (12a, 12b).

According to a fourth aspect of the present invention, there is provided the method of producing the semiconductor device further comprising steps of:

forming a high-melting metallic silicide film (14) on surfaces of the first and second high concentration impurity regions (12a, 12b) after the step of forming the first and second high concentration impurity regions (12a, 12b).

According to a sixth aspect of the present invention, there is provided the method of producing the semiconductor device further comprising steps of:

forming an inter-layer insulating film (15) on an entire surface of the semiconductor substrate (1) after the step of forming the high-melting point metallic silicide film (14); and forming a self-alignment contact opening (17) in a region positioned above the first source/drain area (6b) of the inter-layer insulating film (15), the silicon nitride film (10), and the silicon oxide film (9) formed in the memory device region (100).

According to a seventh aspect of the present invention, there is provided the method of producing the semiconductor device, wherein the step of forming the self-alignment contact opening (17) comprising steps of:

forming a first opening by etching the inter-layer insulating film (15) above the first source/drain area (6b) using the silicon nitride film (10) as an etching stopper film; and forming a second opening reaching the first source/drain area (6b) by etching the silicon nitride film (10) and the silicon oxide film (9) inside the first opening.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein:

FIG. 19 is a cross-sectional view for explaining the method of producing the conventional logic process consolidating device;

FIG. 20 is a cross-sectional view for explaining the method of producing the conventional logic process consolidating device;

FIG. 21 is a cross-sectional view for explaining the method of producing the conventional logic process consolidating device;

FIG. 22 is a cross-sectional view for explaining the method of producing the conventional logic process consolidating device;

FIG. 26 is a cross-sectional view of the conventional logic process consolidating device for illustrating problems of the device;

FIG. 27 is a cross-sectional view of the conventional logic process consolidating device for illustrating problems of the device;

FIG. 28 is a cross-sectional view of the conventional logic process consolidating device for illustrating problems of the device;

DETAILED DESCRIPTION OF THE PREFERRED EMBODIMENTS

A detailed explanation will be given of preferred Embodiments of the present invention in reference to FIGS. 1 through 12 as follows, wherein the same numerical references are used for the same or similar portions and description of these portions is omitted.

Further in the figures, numerical reference 100 designates a memory device region, and numerical reference 101 designates a logic device region.

Embodiment 1

Figure 12:
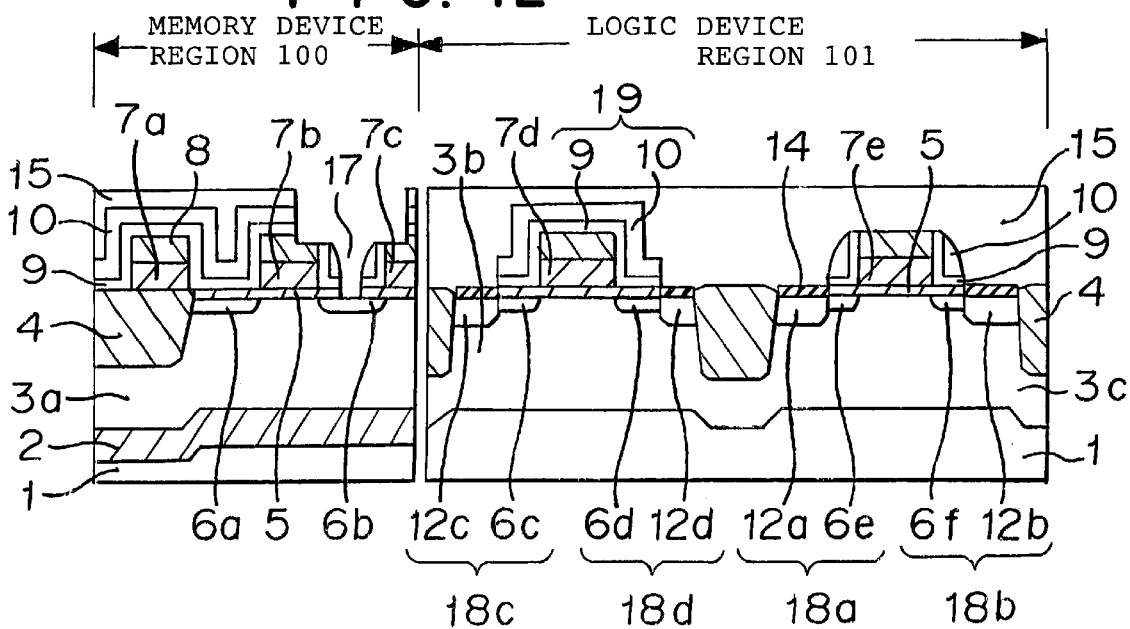
FIG. 12 is a cross-sectional view of the semiconductor device according to Embodiment 1 of the present invention.
Figure 13:
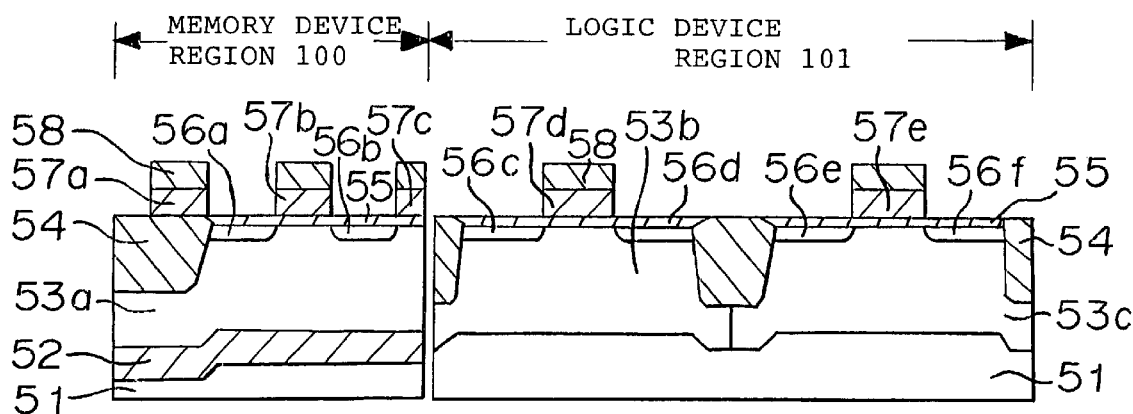
FIG. 13 is a cross-sectional view for explaining a method of producing a conventional logic process consolidating device.
Figure 14:
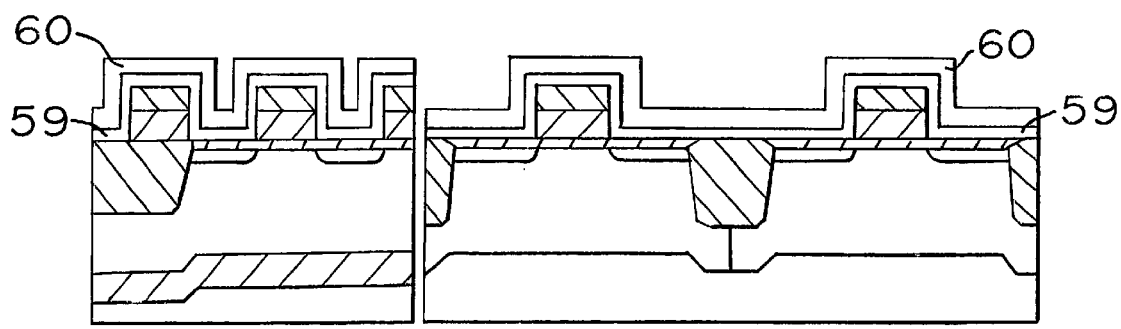
FIG. 14 is a cross-sectional view for explaining the method of producing the conventional logic process consolidating device.
Figure 15:
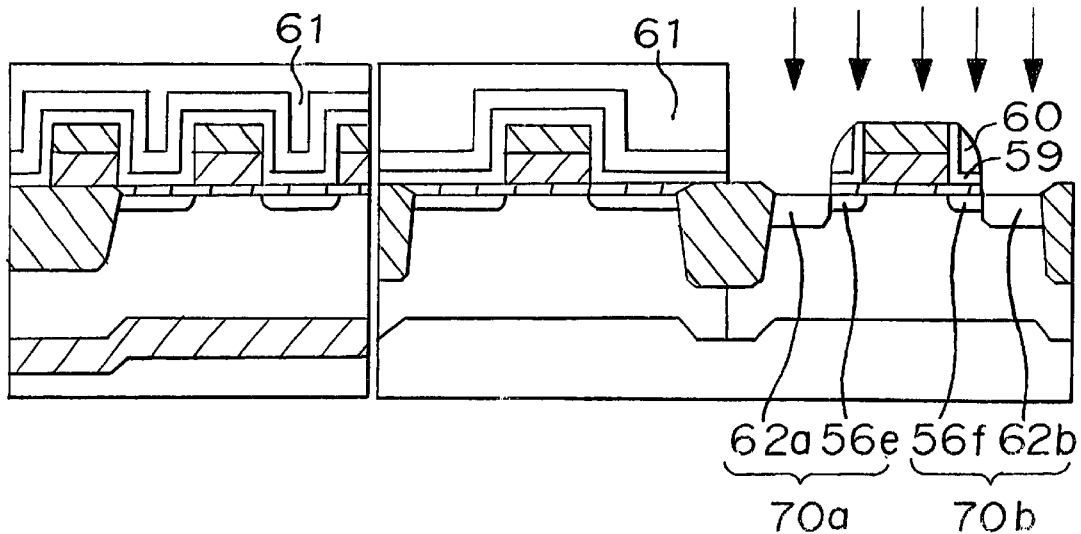
FIG. 15 is a cross-sectional view for explaining the method of producing the conventional logic process consolidating device.
Figure 16:
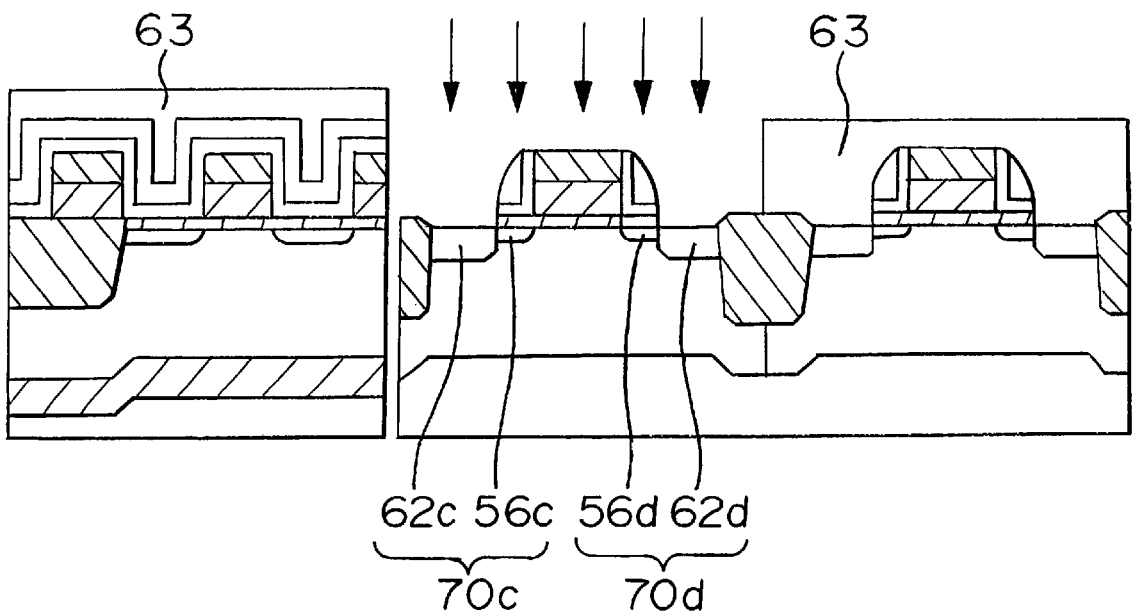
FIG. 16 is a cross-sectional view for explaining the method of producing the conventional logic process consolidating device.
Figure 17:
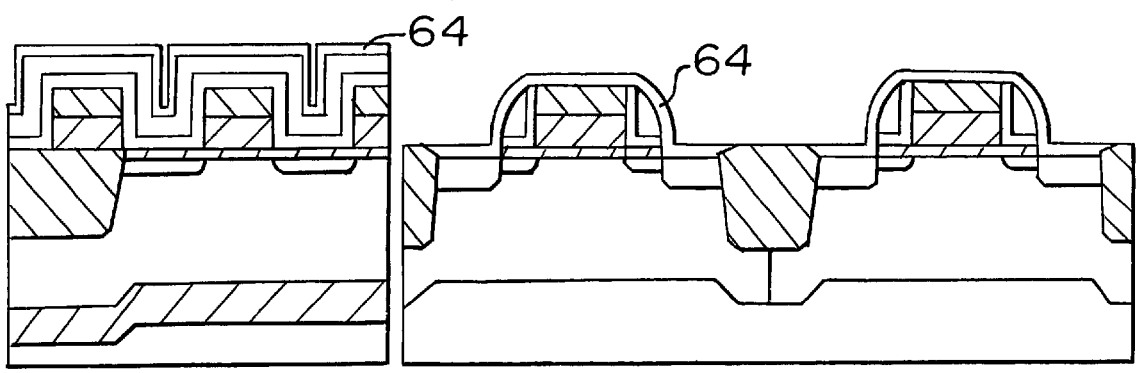
FIG. 17 is a cross-sectional view for explaining the method of producing the conventional logic process consolidating device.
Figure 18:
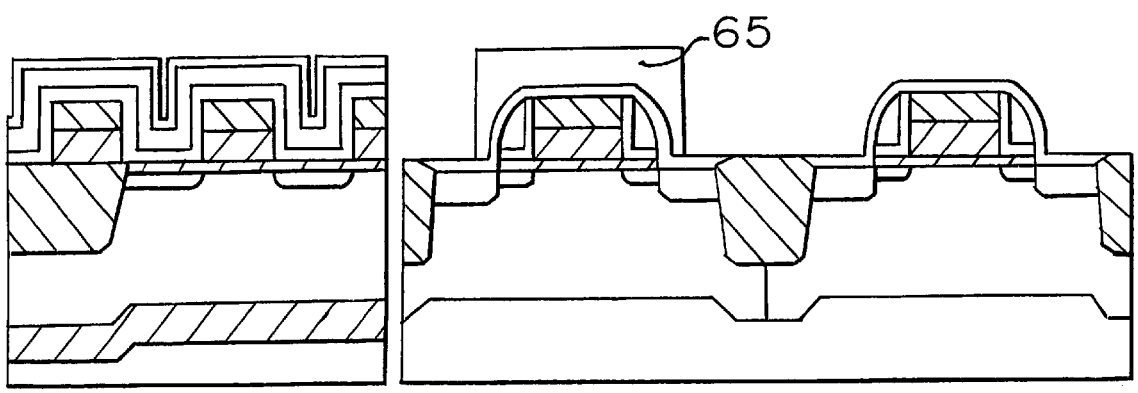
FIG. 18 is a cross-sectional view for explaining the method of producing the conventional logic process consolidating device.
Figure 23:
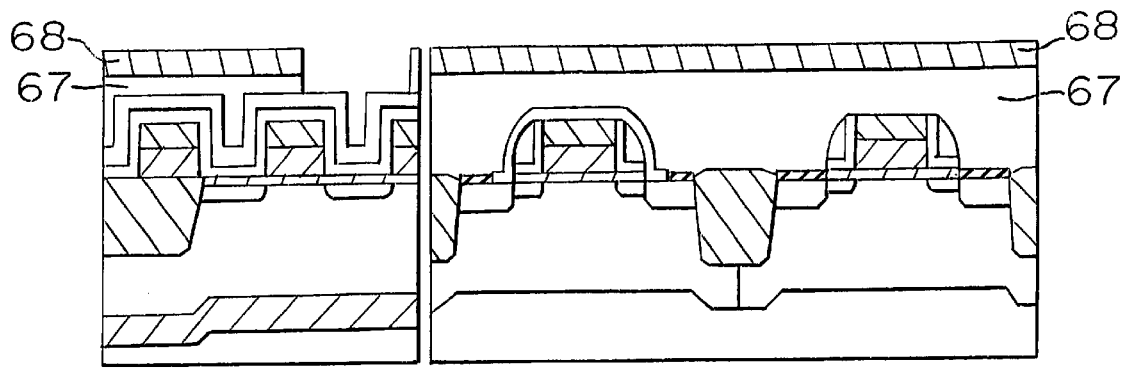
FIG. 23 is a cross-sectional view for explaining the method of producing the conventional logic process consolidating device.
Figure 24:
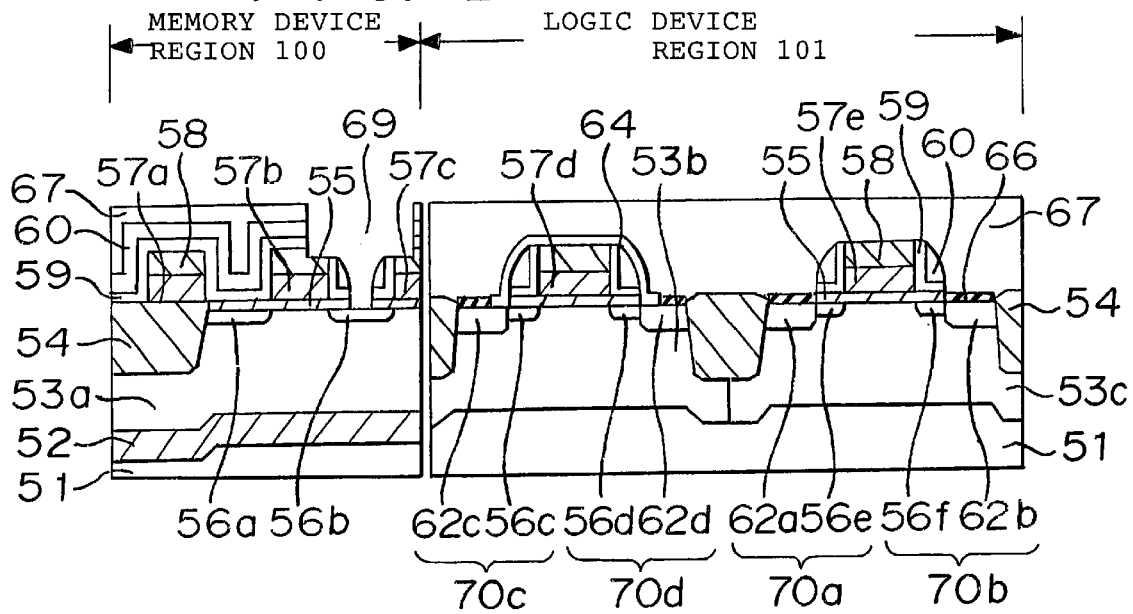
FIG. 24 is a cross-sectional view for illustrating the conventional logic process consolidating device.
Figure 25:
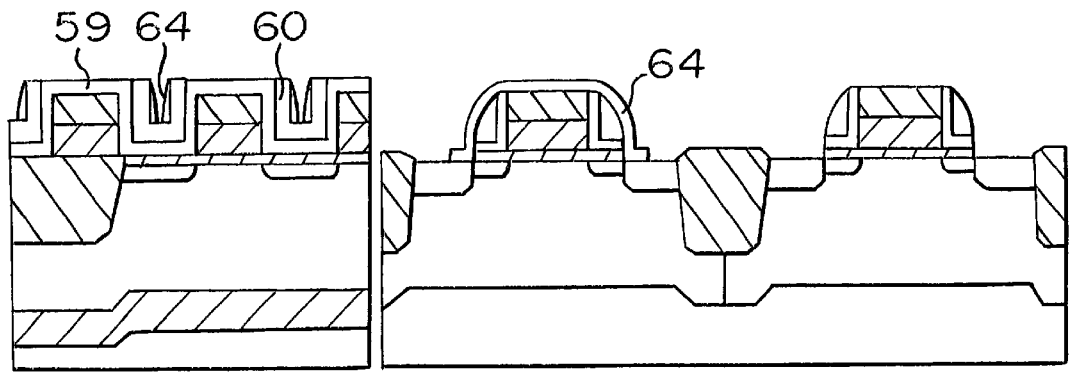
FIG. 25 is a cross-sectional view of the conventional logic process consolidating device for illustrating problems of the device.
Figure 29:
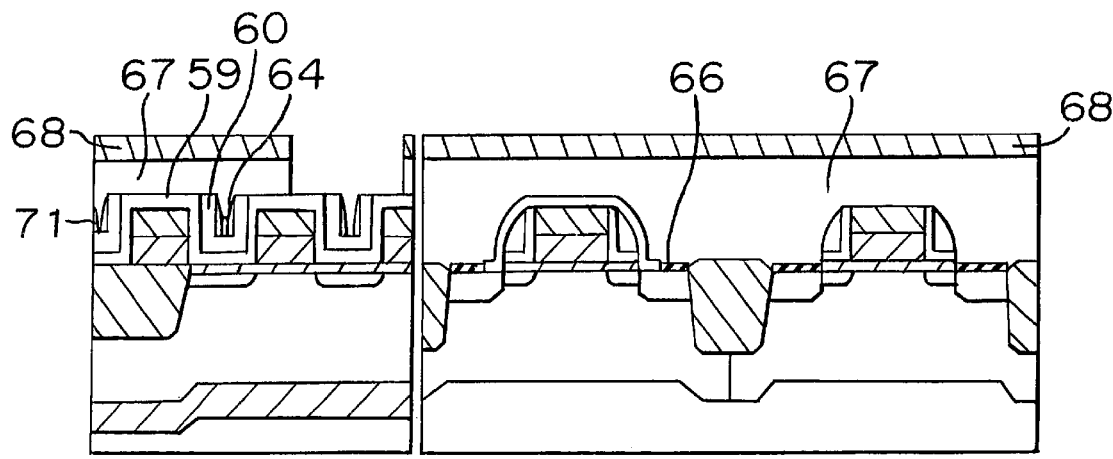
FIG. 29 is a cross-sectional view of the conventional logic process consolidating device for illustrating problems of the device.
Figure 30:
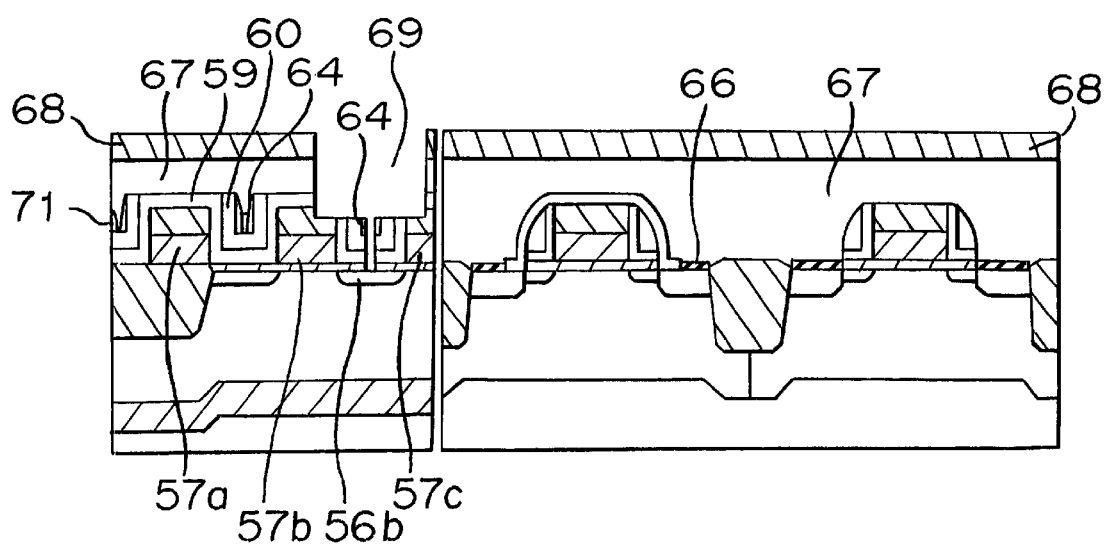
FIG. 30 is a cross-sectional view of the conventional logic process consolidating device for illustrating problems of the device.

FIG. 12 is a cross-sectional view of a DRAM logic process consolidating device according to Embodiment 1 of the present invention. In a memory device region, a bottom n-well 2 and an active region made of a p-well region 3a formed on the bottom n-well 2 are formed on a silicon substrate 1. On a principle surface of the silicon substrate 1, an isolating region 4 and a gate oxide film 5 are formed. Source/drain areas 6a, 6b are formed on the p-well region 3a surrounded by the isolating region 4.

On the gate oxide film 5 and the isolating oxide film 4, gate electrodes 7a through 7c are formed with a predetermined interval. On upper surfaces of the gate electrodes 7a through 7c, an insulating film 8, for example made of silicon nitride film or a TEOS oxide film, is formed. Further, a silicon oxide film 10 is formed on the insulating film 8, the source/drain area 6a, 6b, and the isolating region 4 so as to cover these.

Further, a silicon nitride film 10 is formed to cover an upper surface of the silicon oxide film 9. An inter-layer insulating film 15 is formed to cover the silicon nitride film 10. The inter-layer insulating film 15 is a silicon oxide film containing one or both of boron or phosphorous.

In a region above the source/drain area 6b, the inter-layer insulating film 15, the silicon nitride film 10, the silicon oxide film 9, a part of the insulating film 8 above the gate electrodes 7b and 7c, a self-alignment contact opening 17 penetrating the gate oxide film 5 are formed. The self-alignment contact opening 17 is formed to expose a surface of source/drain area 6b, wherein the self-alignment contact opening 17 is used to connect, for example, a bit wire or a storage node contact of a capacitor cell. Further, a plug made of, for example, a conductive material is formed in the self-alignment contact opening 17 to form a lower electrode of the bit wire or the capacitor (not shown). The lower electrode of the bit wire or the capacitor is electrically connected to the source/drain area 6b through the plug.

On the other hand, in the logic device region, the isolating region 4 is formed on the silicon substrate 1. An active region surrounded by the isolating region 4 is fabricated by an n-well region 3b and a p-well region 3c.

In the n-well region 3b, low concentration impurity regions 6c, 6d and high concentration impurity regions 12c, 12d are respectively formed to construct source/drain areas 18c, 18d having an LDD structure.

In the p-well region 3c on the silicon substrate 1, low concentration impurity regions 6e, 6f and high concentration impurity regions 12a, 12b are formed to construct source/drain areas 18a, 18b having an LDD structure.

A gate electrode 7d is formed on the n-well region 3b through the gate oxide film 5. On an upper surface of the gate electrode 7d, an insulating film 8 made of a silicon nitride film or a TEOS oxide film. Further, the silicon oxide film 9 is formed to cover side surfaces of the gate electrode 7d and the insulating film 8, an upper portion of the insulating film 8, and the gate oxide film 5. On the silicon oxide film 9, the silicon nitride film 10 is formed. The silicon oxide film 9 and the silicon nitride film 10 are a silicide protection film and side wall 19 having dual functions as a side wall of the gate electrode 7d and of silicide protection in a logic device.

In the n-well region 3b, edges of the high concentration impurity regions 12c, 12d on a side of the low concentration impurity regions are the silicide protection film and side wall 19. This is necessary because the high concentration impurity regions 12c, 12d are formed using the silicide protection film and side wall 19 as a mask. Therefore, it is unnecessary to optimize a condition of implanting ions in consideration of a film thickness of the gate electrode and so on at time of implanting ions for forming the high concentration impurity regions 12c, 12d, whereby a degree of freedom of a condition of applying an energy and so on.

In the p-well region 3c, the gate electrode 7e is formed through the gate oxide film 5. On an upper surface of the gate electrode 7e, the insulating film made of a silicon nitride film or a TEOS oxide film is formed. Further, a side wall fabricated by the silicon oxide film 9 and the silicon nitride film 10 is formed so as to be in contact with side surfaces of the gate electrode 7e and the insulating film 8 formed thereon.

On exposed surfaces of the source/drain areas 18a through 18d, on which the silicide protection film and side wall 19 is not formed, a high melting metallic silicide film 14, made of for example a cobalt silicide film and a titanium silicide film, is formed.

The inter-insulating film 15 is formed to cover an entire surface of the semiconductor substrate 1. In the logic process consolidating device according to Embodiment 1, a conduction type of the active region and a conduction type of the impurity to be implanted are not limited to those described above and adverse conduction types may be used.

Embodiment 2

In the next, a method of producing the DRAM logic process consolidating device described in Embodiment 1 will be described in reference of FIGS. 1 through 12.

Figure 1:
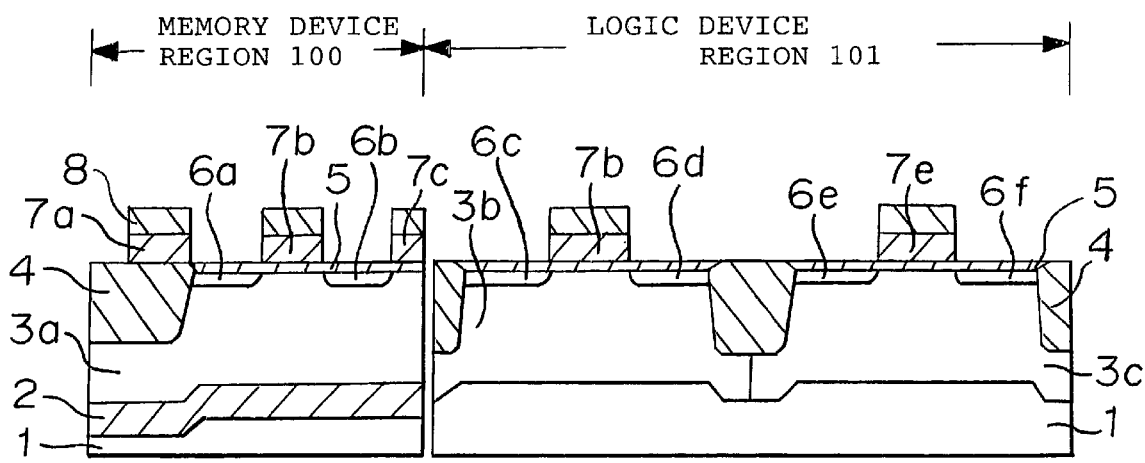
FIG. 1 is a cross-sectional view of a semiconductor device for illustrating a method of producing the semiconductor device according to Embodiment 1 of the present invention.

As illustrated in FIG. 1, the isolating region 4 is formed on the principle surface of the silicon substrate 1, on which the bottom n-well 2, the p-well region 3a, the n-well region 3b, and the p-well region 3c are formed. A structure of the isolating region 4 is formed by opening a deep groove in the silicon substrate 1 and embedding an insulating film such as an oxide film in use of a shallow trench isolation (STI) process.

On the principle surface of the silicon substrate 1, the gate oxide film 5 made of, for example, a silicon oxide film by thermal oxidization and so on. An oxynitride film obtained by nitriding a silicon oxide film may be used as the gate oxide film. The gate electrodes 7a through 7e are formed on the gate oxide film 5 or the isolating oxide film 4. Further, the insulating film 8 is formed on the gate electrodes 7a through 7e. The gate electrodes 7a through 7e and the insulating film 8 formed thereon are formed by patterning using a single mask such as a resist. The source/drain areas 6a, 6b and the low concentration impurity regions 6c through 6f are formed by implanting ions, namely an n-type impurity into the p-well regions 3a, 3c and a p-type impurity into the n-well region 3b, using the gate electrodes 7a through 7e and the insulating film 8 formed thereon as a mask.

Figure 2:
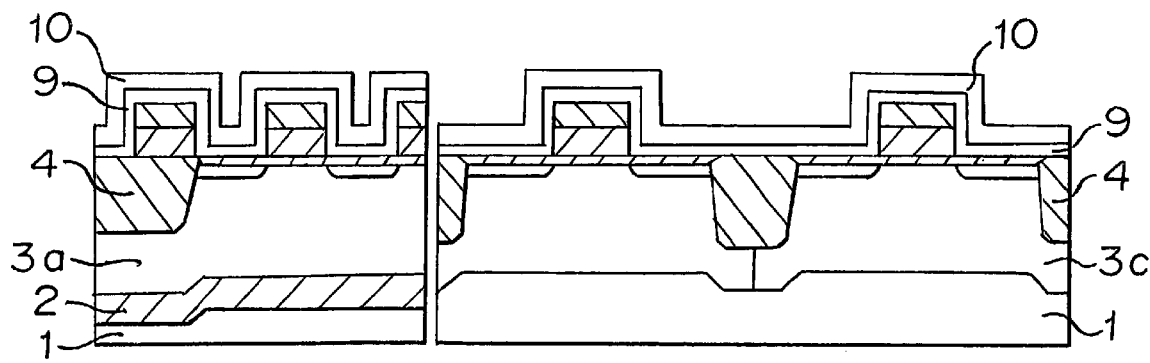
FIG. 2 is a cross-sectional view of the semiconductor device for explaining the method of producing the semiconductor device according to Embodiment 1 of the present invention.
Figure 3:
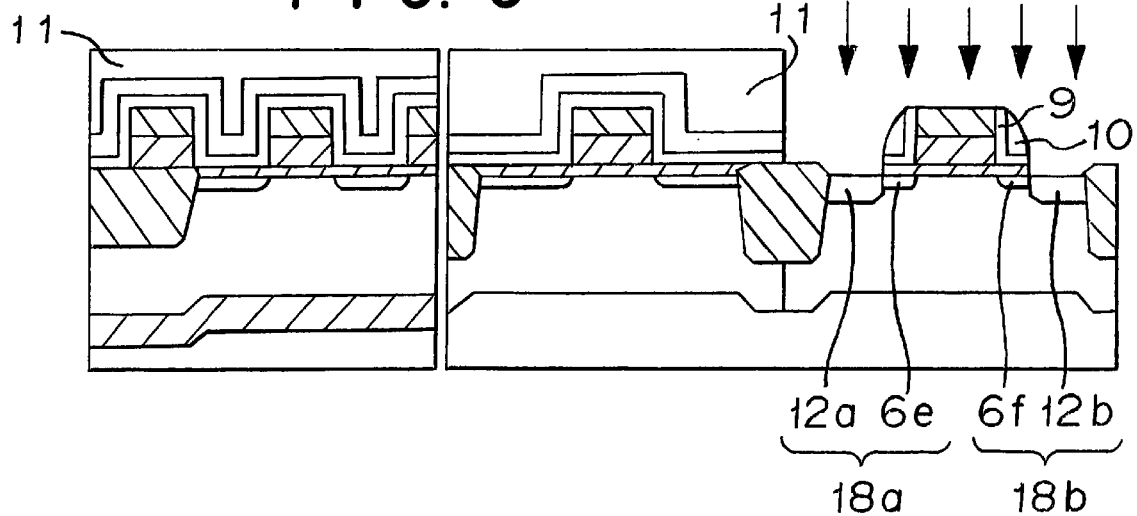
FIG. 3 is a cross-sectional view of the semiconductor device for explaining the method of producing the semiconductor device according to Embodiment 1 of the present invention.

In the next, as illustrated in FIG. 2, the silicon oxide film 9 is formed above the entire surface of the silicon substrate 1 so as to cover the gate electrodes 7a through 7e and the insulating film 8 formed thereon. The silicon nitride film 10 is formed on the silicon oxide film 9. As illustrated in FIG. 3, an n-type transistor region is formed in the logic device region by photoengraving after coating the resist 11.

Thereafter, the silicon oxide film 9 and the silicon nitride film 10 are subjected to anisotropic etching to form the side walls on both sides of the gate electrode 7e and the insulating film 8 thereon. Further, an n-type impurity is further implanted in a self-replicating manner using the side wall and so on as a mask, whereby the high concentration impurity regions 12a, 12b are formed. Thus, the source/drain area 18a having an LDD structure is fabricated by the low concentration impurity region 6e and the high concentration impurity region 12a. Also the source/drain area 18b having an LDD structure is fabricated by the low concentration impurity region 6f and the high concentration impurity region 12b. A pair of the source/drain areas is thus formed with an interval so as to interpose a channel region.

Figure 4:
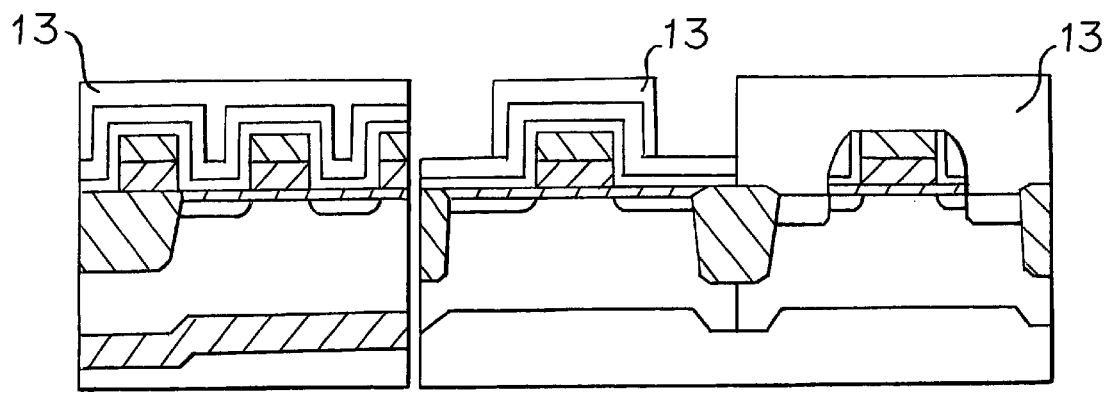
FIG. 4 is a cross-sectional view of the semiconductor device for explaining the method of producing the semiconductor device according to Embodiment 1 of the present invention.
Figure 5:
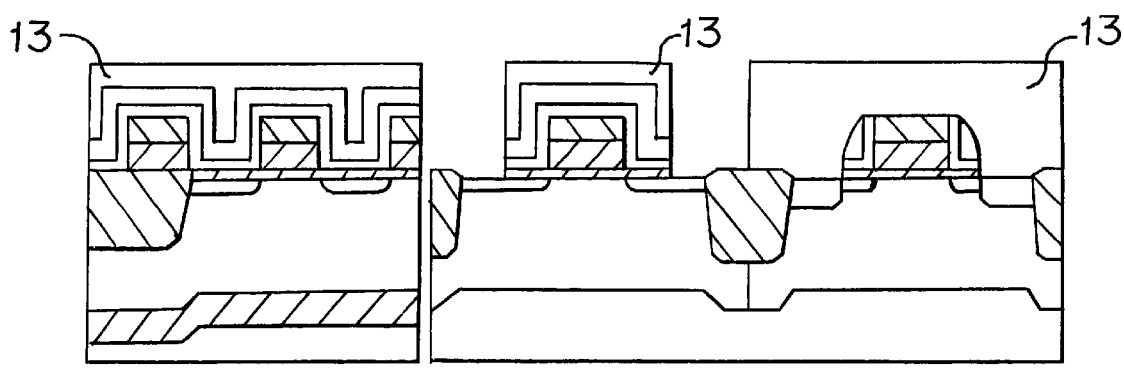
FIG. 5 is a cross-sectional view of the semiconductor device for explaining the method of producing the semiconductor device according to Embodiment 1 of the present invention.

As illustrated in FIG. 4, a resist pattern 13 is formed on only portions, in which the silicon oxide film 9 and the silicon nitride film 10 above the gate electrode 7d in the p-type transistor region of the logic device region. As illustrated in FIG. 5, the silicon oxide 9 and the silicon nitride film 10, and the gate oxide film 5 are subjected to anisotropic etching using the resist pattern 13 as a mask.

Figure 6:
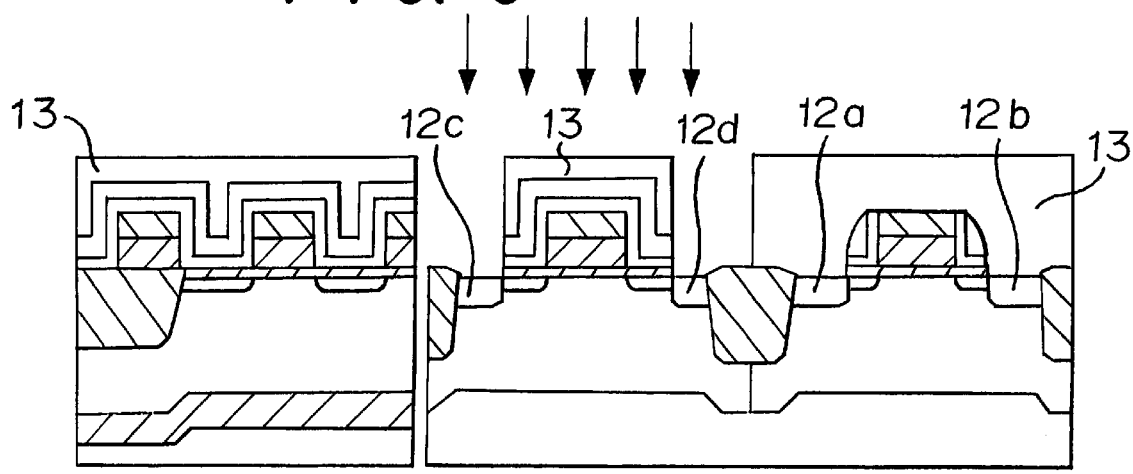
FIG. 6 is a cross-sectional view of the semiconductor device for explaining the method of producing the semiconductor device according to Embodiment 1 of the present invention.

As illustrated in FIG. 6, a p-type impurity is further implanted using the resist 13 as a mask to form the high concentration impurity regions 12c, 12d. The source/drain area 18c having an LDD structure is fabricated by the low concentration impurity region 6c and the high concentration impurity region 12c. Also the source/drain area 18d having a LDD structure is fabricated by the low concentration impurity region 6d and the high concentration impurity region. Thus a pair of the source/drain areas 18c and 18d is formed with an interval so as to interpose a channel region.

Figure 7:
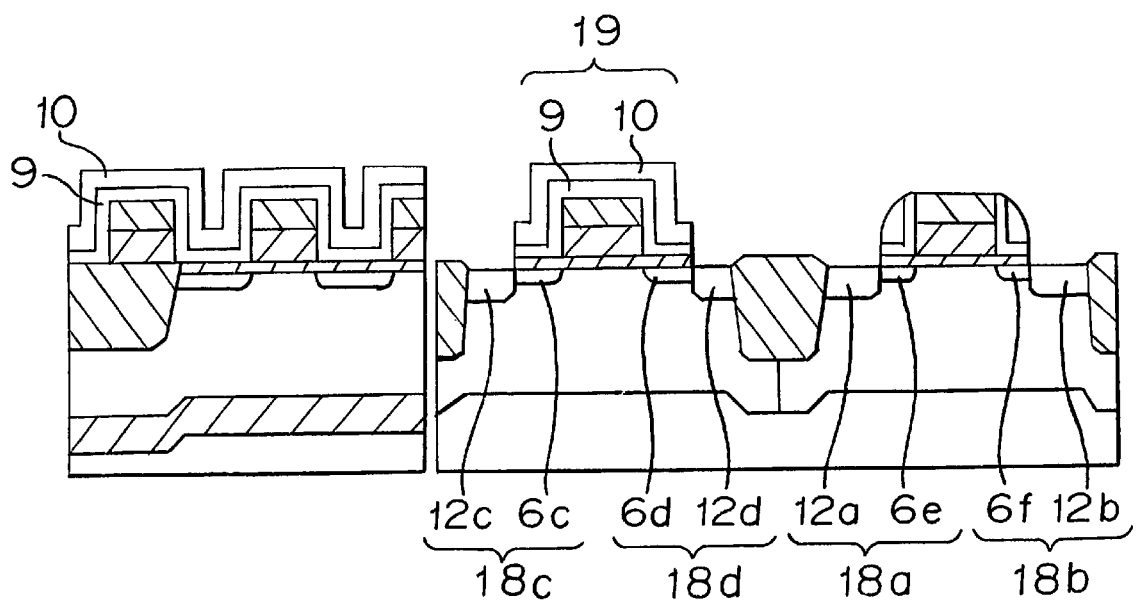
FIG. 7 is a cross-sectional view of the semiconductor device for explaining the method of producing the semiconductor device according to Embodiment 1 of the present invention.
Figure 8:
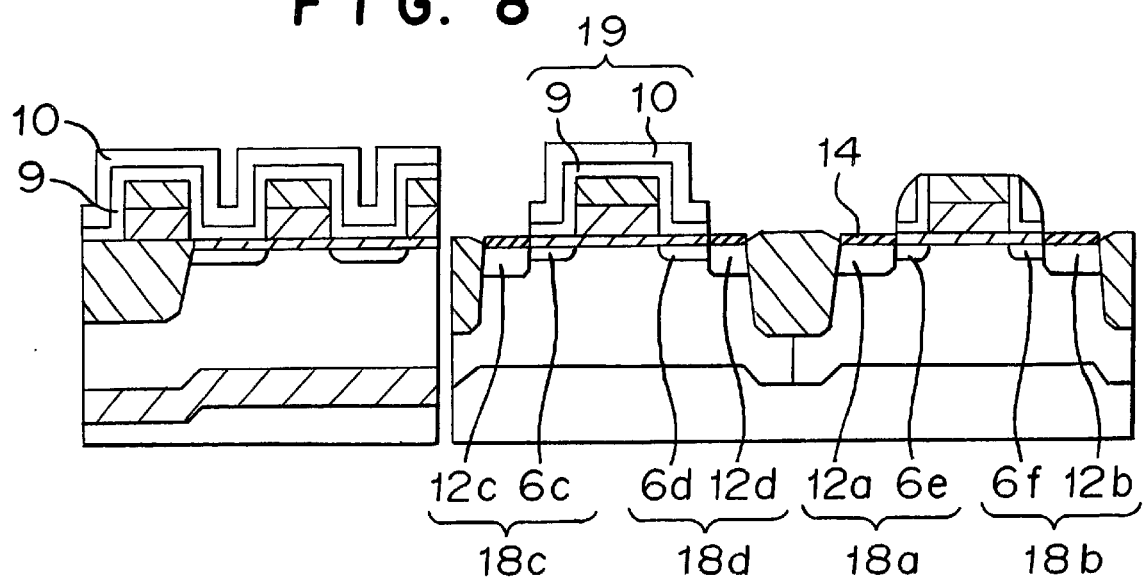
FIG. 8 is a cross-sectional view of the semiconductor device for explaining the method of producing the semiconductor device according to Embodiment 1 of the present invention.

As illustrated in FIG. 7, after removing the resist pattern 13, the high-melting metallic silicide film 14 made of, for example, cobalt silicide or titanium silicide, is formed on surfaces of the high concentration impurity regions 12a through 12d in the logic device region using the silicon oxide film 9 and the silicon nitride film 10 as a silicide protection film as illustrated in FIG. 8. The high-melting metallic silicide film 14 is formed by evaporating cobalt or titanium and thereafter making this react with the silicon substrate 1 by a thermal reaction.

Figure 9:
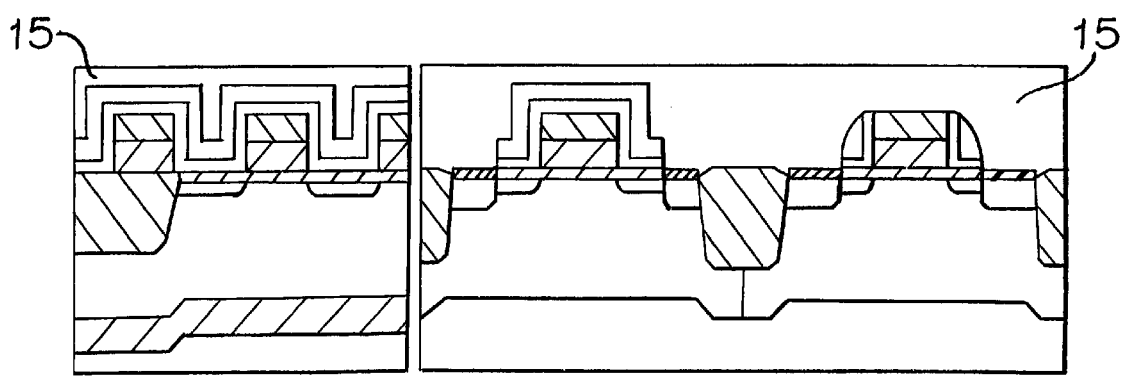
FIG. 9 is a cross-sectional view of the semiconductor device for explaining the method of producing the semiconductor device according to Embodiment 1 of the present invention.
Figure 10:
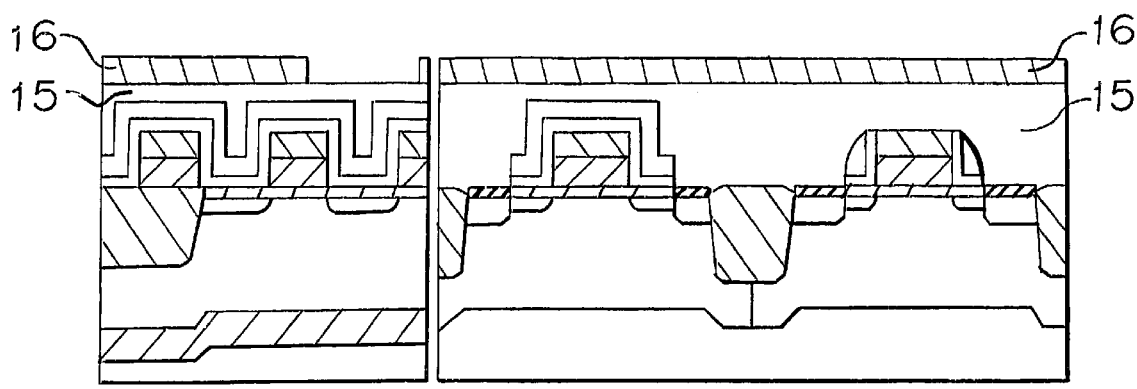
FIG. 10 is a cross-sectional view of the semiconductor device for explaining the method of producing the semiconductor device according to Embodiment 1 of the present invention.
Figure 11:
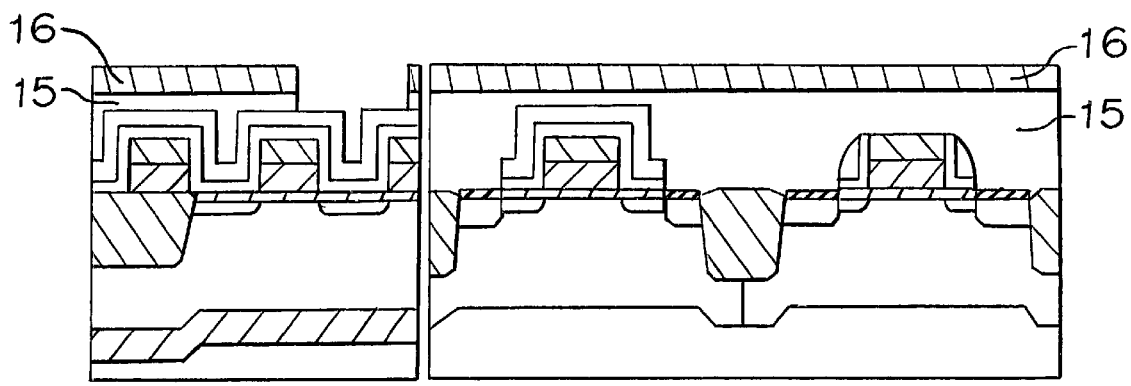
FIG. 11 is a cross-sectional view of the semiconductor device for explaining the method of producing the semiconductor device according to Embodiment 1 of the present invention.

In the next, as illustrated in FIG. 9, the inter-layer insulating film 15 is formed above the entire surface of the silicon substrate 1. As illustrated in FIG. 10, a resist 16 is coated, and a part of the resist 16 above the source/drain area 6b in the memory device region is patterned by photoengraving. As illustrated in FIG. 11, the inter-layer insulating film 15 is subjected to anisotropic etching using the resist 16 as a mask and the silicon nitride film 10 as an etching stopper.

After removing the resist 16, as illustrated in FIG. 12, the silicon nitride film 10, the silicon oxide film 9, a part of the insulating film 8, and the silicon oxide film 5 are subjected to anisotropic etching to expose the source/drain area 6b. As a result, the self-alignment contact opening 17 is formed. The opening 17 is used as a contact hole, in which a contact plug between a bit wire (not shown) and the source/drain area 6b, a contact plug between a lower electrode of a capacitor cell and the source/drain area 6b, and other plugs.

The first advantage of the semiconductor device according to the present invention is that the self-alignment contact opening in the memory device region can be easily formed without deteriorating reliability of the semiconductor device; the number of the steps of processing the semiconductor device can be suppressed; and a degree of freedom in a condition of implanting ions becomes high.

The second advantage of the semiconductor device according to the present invention is that a process of forming a silicide protection film in the logic device region can be omitted and therefore the number of steps in processing the semiconductor device can be reduced; and the self-alignment contact opening can be formed and therefore deterioration of reliability of the semiconductor device can be suppressed.

The third advantage a method of producing the semiconductor device according to the present invention is that the number of steps in producing the semiconductor device can be reduced.

The fourth advantage the method of producing the semiconductor device according to the present invention is that parasitic resistances of the first and second high concentration impurity regions can be reduced.

The fifth advantage the method of producing the semiconductor device according to the present invention is that reliability of the semiconductor device can be prevented from deteriorating.

The sixth advantage the method of producing the semiconductor device according to the present invention is that the self-alignment contact can be opened without deteriorating reliability of the semiconductor device.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. Hei 12-002356 filed on Jan. 11, 2000 including specification, claims, drawings and summary are incorporated herein by reference in its entirety.

What is claimed is:

1. A semiconductor device having a memory device region and a logic device region on a principle surface of a semiconductor substrate comprising:

a pair of first and second source/drain areas formed with an interval so as to sandwich a first channel region on a principle surface of said memory device region;

a pair of first and second low concentration impurity regions formed with an interval so as to sandwich a second channel region on a principle surface of said logic device region;

a first gate electrode and a second gate electrode formed on a gate oxide film respectively formed on said first channel region and said second channel region;

silicon oxide film formed so as to cover said first gate electrode and said second gate electrode;

a silicon nitride film formed on said silicon oxide film;

an inter-layer insulating film formed on said silicon nitride film;

a self-alignment contact opening formed in an area above said first source/drain area of said inter-layer insulating film, said silicon nitride film, and said silicon oxide film formed on said memory device area;

a side wall film made of said silicon oxide film and said silicon nitride film extending through areas above said first and second low concentration impurity regions so as to cover an upper portion and a side wall of said second gate electrode formed on said logic device area;

first and second high concentration impurity regions formed from end portions of said side wall film on said semiconductor substrate formed on said logic device area; and a high-melting metallic silicide film formed on said semiconductor substrate surfaces of said first and second high concentration impurity regions, wherein said silicon oxide film and said silicon nitride film formed on said upper portion and said side surface of the second gate electrode in said logic device region have a function as a silicon protection film in addition to a function as the side wall film for said second gate electrode.

* * * * *